United States Patent [19]

Hartman et al.

[11] Patent Number: 5,309,841

[45] Date of Patent: * May 10, 1994

[54] ZENER DIODE FOR PROTECTION OF INTEGRATED CIRCUIT EXPLOSIVE BRIDGE

[75] Inventors: J. Keith Hartman; Carroll B. McCampbell, both of Albuquerque, N. Mex.

[73] Assignee: SCB Technologies, Inc., Albuqerque, N. Mex.

[*] Notice: The portion of the term of this patent subsequent to Nov. 12, 2010 has been disclaimed.

[21] Appl. No.: 996,745

[22] Filed: Dec. 24, 1992

Related U.S. Application Data

[63] Continuation-in-part of Ser. No. 771,983, Oct. 8, 1991, Pat. No. 5,179,248.

[51] Int. Cl.⁵ .......................... F42B 3/13; F42B 3/182
[52] U.S. Cl. .............................. 102/202.4; 102/202.1; 102/202.5
[58] Field of Search ............... 102/202.1, 202.2, 202.3, 102/202.4, 202.5, 202.7, 202.8

[56] References Cited

U.S. PATENT DOCUMENTS

| | | | |
|---|---|---|---|
| 2,408,125 | 9/1946 | Rolfes | 102/202.2 |
| 2,801,585 | 8/1957 | Smith | 102/202.14 |
| 2,821,139 | 1/1958 | Apstein et al. | 102/202.2 |
| 2,878,752 | 3/1959 | Johnson et al. | 102/202.4 |
| 3,180,263 | 4/1965 | Williams, Jr. | 102/202.4 |
| 3,610,153 | 10/1971 | Betts et al. | 102/202.5 |
| 3,640,224 | 2/1972 | Petrick et al. | 102/202.5 |
| 4,261,263 | 4/1981 | Coultas et al. | 102/202.7 |
| 4,592,280 | 6/1986 | Shores | 102/202.2 |
| 4,708,060 | 11/1987 | Bickes, Jr. et al. | 102/202.7 |
| 4,712,477 | 12/1987 | Aikou et al. | 102/202.5 |
| 4,729,325 | 3/1988 | Proffit et al. | 102/202.5 |
| 4,819,560 | 4/1989 | Patz et al. | 102/202.5 |
| 4,840,122 | 6/1989 | Nerheim | 102/202.5 |
| 4,893,563 | 1/1990 | Baginski | 102/202.1 |
| 4,893,564 | 1/1990 | Ochi et al. | 102/202.1 |
| 4,967,665 | 11/1990 | Baginski | 102/202.2 |
| 4,976,200 | 12/1990 | Benson et al. | 102/202.7 |
| 5,085,146 | 2/1992 | Baginski | 102/202.5 |
| 5,179,248 | 1/1993 | Hartman et al. | 102/202.4 |

OTHER PUBLICATIONS

Jan. 1987, "Semiconductor Bridge (SCB) Development Technology Transfer Symposium," Sandia Report, SAND 86-2211 (bullet) UC-13, R. W. Bickles, Jr., editor, Sandia National Laboratories, Albuquerque, New Mexico and Livermore, Calif.

*Primary Examiner*—Daniel T. Pihulic
*Attorney, Agent, or Firm*—Lowe, Price, LeBlanc & Becker

[57] ABSTRACT

An integrated circuit bridge comprises a substrate of non-electrically conductive material and a semiconductor layer on the substrate. First and second metal lands form contacts of the semiconductor bridge. An explosive charge bridges a gap between the metal lands. The lands, gap, semiconductor bridge, and charge are dimensioned and arranged so that in response to a current equal to or in excess of a predetermined level having a duration equal to or in excess of a predetermined value being applied across the gap, a plasma having sufficient energy to energize the explosive is formed in the gap. The predetermined current has a predetermined minimum firing voltage associated with it. The bridge is one of a lot having a firing voltage standard deviation of about 0.05 volts. Premature energization of the explosive by electrostatic discharge and voltages greater than the firing voltage and by AC induced voltages is prevented by connecting a zener diode across the first and second lands. The zener diode is chosen to conduct in the backward direction in response to a positive voltage of about 1.1 times the predetermined minimum firing voltage being applied across it. The bridge comprises a tungsten layer that extends across the gap on the semiconductor layer. The lands have a resistivity much smaller than that of the tungsten layer.

18 Claims, 3 Drawing Sheets

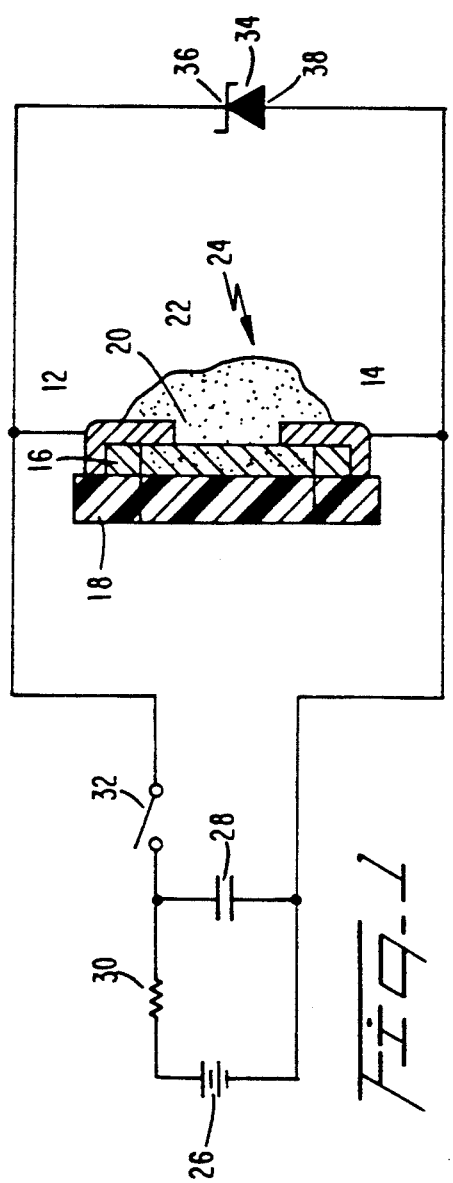
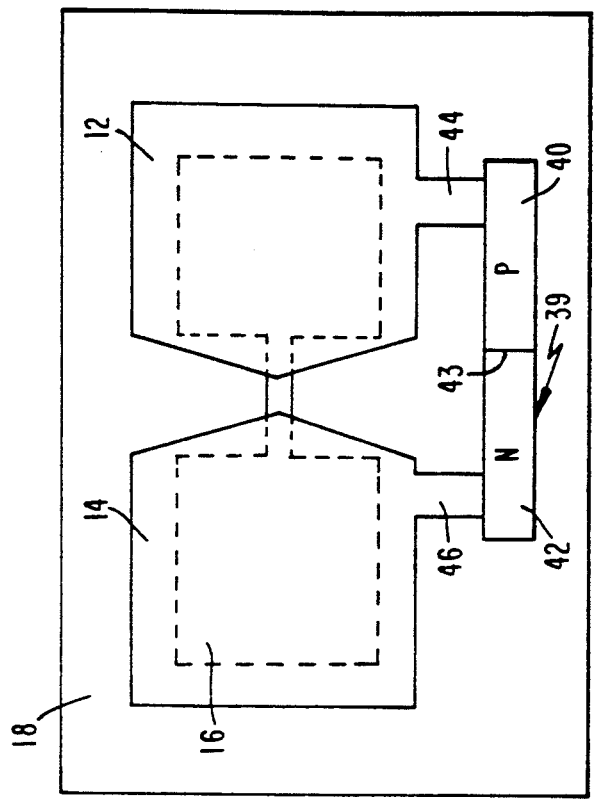

ZENER DIODE FOR PROTECTION OF INTEGRATED CIRCUIT EXPLOSIVE BRIDGE

RELATION TO CO-PENDING APPLICATION

The present application is a continuation in part of application Ser. No. 07/771,983, filed on Oct. 8, 1991 and now U.S. Pat. No. 5,179,248, issued on Jan. 12, 1993, and titled ZENER DIODE FOR PROTECTION OF SEMICONDUCTOR EXPLOSIVE BRIDGE.

TECHNICAL FIELD

The present invention relates generally to protecting explosive initiators, and more particularly, to a protective zener diode that is connected directly across spaced electrically conductive lands of an integrated circuit bridge for activating an explosive initiator.

BACKGROUND ART

The vast majority of currently used explosive initiators, i.e., detonators, employ an electric heating wire in contact with an explosive charge. In response to a voltage being applied to the wire, frequently referred to as a bridge wire, current heats the wire to sufficient temperature to cause the explosive charge to be detonated. Representative devices of this type are disclosed in U.S. Pat. Nos. 2,801,585 and 2,878,752.

It has long been recognized that prior art devices of a type disclosed in the '585 and '752 patents are subject to accidental firing due to electrostatic discharge (ESD) or electromagnetic interference (EMI) induced current. The danger of accidental, i.e., premature, firing is particularly acute in situations where electro-explosive initiators are subjected to lightning discharges or electrostatic discharges accumulated by moving machines, e.g. motors and generators, or people, as well as to intense electromagnetic fields as subsist, for example, on naval ships, spacecraft, and aircraft.

In consequence, it has been the general practice to provide protection devices to prevent ESD and EMI induced current initiation of electro-explosive initiators. It is necessary for these protection devices to have no effect on the sensitivity of the electro-explosive initiator to normal firing signals, usually in the form of DC current. Ideally, the protection device does not result in a substantial increase in the cost of the electro-explosive initiator and is not particularly complex.

Many different approaches have been disclosed and used in the prior art to prevent premature activation of electro-explosive initiators. In one technique, a discharge is initiated at a location displaced from the explosive material, such as at the discharge teeth, as taught in U.S. Pat. No. 2,408,125, or at the spark gap, as disclosed in U.S. Pat. Nos. 3,180,263 and 4,261,263. In another approach, a low pass filter including inductive, capacitive, and resistive components, is arranged in various configurations, to prevent radio frequency energy from being coupled to the electro-explosive initiator. Such prior art devices are disclosed, e.g., in U.S. Pat. Nos. 2,821,139 and 4,592,280. Voltage detection devices, including zener diodes, have also been used to activate switches to decouple explosive initiators from ESD and EMI induced currents. Prior art devices including zener diodes for these purposes are disclosed in U.S. Pat. Nos. 4,967,665 and 4,819,560.

The prior art protection devices are relatively expensive and complex, compared to the cost and complexity of the bridge wire, the explosive charge, and the housing for them. A main reason for the high cost and complexity of the prior art devices to protect explosive initiators using heating wires is that the characteristics of the wires, even in the same lot, vary substantially from explosive initiator to explosive initiator. For example, a wire explosive initiator designed to activate an explosive charge in response to a current of 0.6 ampere being applied to it for 1 millisecond may, in fact, activate the charge in response to a current as small as 0.2 amperes being applied to it. The standard deviation, i.e., square root of the variance, of prior art explosive initiators is thus relatively high. Because of this factor, the prior art ESD and EMI induced current protection devices must be designed to tolerate very wide variations in applied current and voltage to prevent premature activation of electro-explosive initiators.

It is, accordingly, an object of the present invention to provide a new and improved protection device for electro-explosive initiators, which protection device is extremely simple and inexpensive.

To achieve this object, the present invention relies on the discovery that the standard deviation of the voltage necessary to activate a recently introduced class of integrated circuit electro-explosive initiator is extremely low, e.g., 0.05 volts. Because of the low standard deviation of the voltage necessary to initiate an explosive discharge of these devices, it is possible to provide adequate protection for both ESD and EMI induced currents by using a very simple voltage detection device that shunts the electro-explosive initiator when the DC voltage applied to the initiator exceeds a predetermined value which is derived from an energizing circuit for the initiator.

One type of the recently-introduced device is disclosed in U.S. Pat. No. 4,708,060, as well as in a report printed January 1987 entitled "Semiconductor Bridge (SCB) Development Technology Transfer Symposium," Sandia Report, SAND86-2211 (bullet) UC-13, R. W. Bickes, Jr., editor, prepared by Sandia National Laboratories, Albuquerque, N. Mex. 87185 and Livermore, Calif. 94550 for the United States Department of Energy under contract D-AC04-76DP00789. The device includes a non-metallic substrate that carries a highly doped semiconductor (silicon) layer. First and second electrically conductive lands, usually fabricated of aluminum or tungsten, are deposited on the semiconductor layer, such that a gap subsists between them. The substrate may be silicon on which an oxide layer is formed, and the doped Si layer is deposited on the oxide layer. Alternatively, the substrate is sapphire on which is deposited the doped Si layer.

Another type of the recently introduced integrated circuit devices is disclosed in U.S. Pat. No. 4,976,200, wherein the plasma is formed in a relatively high resistivity metal layer, particularly tungsten, that bridges a gap between a pair of low resistivity lands. The structure is carried by a non-electrically conducting surface, preferably an oxide layer deposited on an undoped silicon substrate. The metal layer and lands are deposited on a semiconductor layer, preferably undoped silicon.

In both of these types of devices an explosive charge contacts the lands and bridges the gap. In response to a voltage exceeding a predetermined level being applied by the lands across the gap for a predetermined duration, a plasma is established in the gap. The plasma initiates the explosive charge, thereby causing initiation or detonation.

The various layers and electrodes of these prior art devices are fabricated using integrated circuit techniques. A non-metallic wafer having, e.g. a diameter of 4–6 inches, is prepared. Masking and deposition techniques are used to form several hundred separate devices on the wafer. After the various layers and lands are deposited, the wafer is diced into several hundred chips, each including an integrated circuit bridge which is mounted on a header and charge holder combination. The resulting structure is then loaded with an explosive charge.

It has been found that electro-explosive initiators manufactured in accordance with these techniques, utilizing the structures of both the '060 and '200 patents, have a very low standard deviation of the voltage necessary to initiate explosive action. Generally, for a particular lot, the standard deviation is about 0.05 volts. This means, for example, that if a particular integrated circuit bridge explosive initiator is designed, i.e. rated, to explode in response to a voltage of 5.0 volts being applied to it for 10 microseconds, the likelihood of a DC voltage as low as 4.60 volts initiating an explosive discharge is about one in 100 million! Likewise, a voltage of 5.40 volts will initiate an explosion with a probability of failure of only 1 in 100 million.

It is, accordingly, another object of the present invention to provide an extremely simple and low cost device for preventing both ESD and EMI induced currents from prematurely activating an integrated circuit bridge, explosive initiator.

DISCLOSURE OF THE INVENTION

In accordance with the present invention, there is provided a new and improved device for preventing ESD or EMI induced currents from activating an integrated circuit bridge explosive initiator. The integrated circuit bridge explosive initiator comprises a substrate of non-electrically conductive material which carries a semiconductor layer. First and second metal lands form contacts of the integrated circuit bridge. The metal lands are arranged so there is a gap between them across the integrated circuit bridge. An explosive charge is pressed on top of and between the lands. The lands, gap, integrated circuit bridge, and charge are dimensioned and arranged so that in response to a voltage or current equal to or in excess of a predetermined level having a duration equal to or in excess of a predetermined value being applied to the gap, a plasma having sufficient energy to energize the explosive is formed in the gap. The predetermined current has a predetermined minimum firing voltage associated with it. The integrated circuit explosive bridge initiator is one of a lot having a firing voltage standard deviation of about 0.05 volts.

The device for preventing the discharge includes and preferably consists of a zener diode having anode and cathode electrodes respectively connected to the first and second lands. The zener diode conducts (a) in the forward direction when the anode voltage is about 0.6 volts higher than the cathode voltage and (b) in the backward direction when the cathode voltage is positive relative to the anode and is slightly more than the predetermined minimum firing voltage of the integrated circuit bridge.

The integrated circuit can include either a doped semiconductor layer, as in the '060 patent, or a tungsten layer, as in the '200 patent. We have found through actual experimentation that both of these types of devices have the required very low standard deviations, permitting zener diodes to be used with them as indicated.

In one preferred embodiment, the zener diode is an integrated component on the substrate carrying the integrated circuit bridge explosive initiator, while in a second embodiment, the zener diode is a discrete component.

The above and still further objects, features, and advantages of the present invention will become apparent upon consideration of the following detailed description of several specific embodiments thereof, especially when taken in conjunction with the accompanying drawings.

BRIEF DESCRIPTION OF THE DRAWING

FIG. 1 is a circuit diagram of a preferred embodiment of the invention disclosed in the aforementioned application;

FIG. 2 is a top view of an integrated circuit bridge explosive initiator and a zener diode as disclosed in the aforementioned application;

DESCRIPTION OF THE PREFERRED EMBODIMENTS

Figure 3:
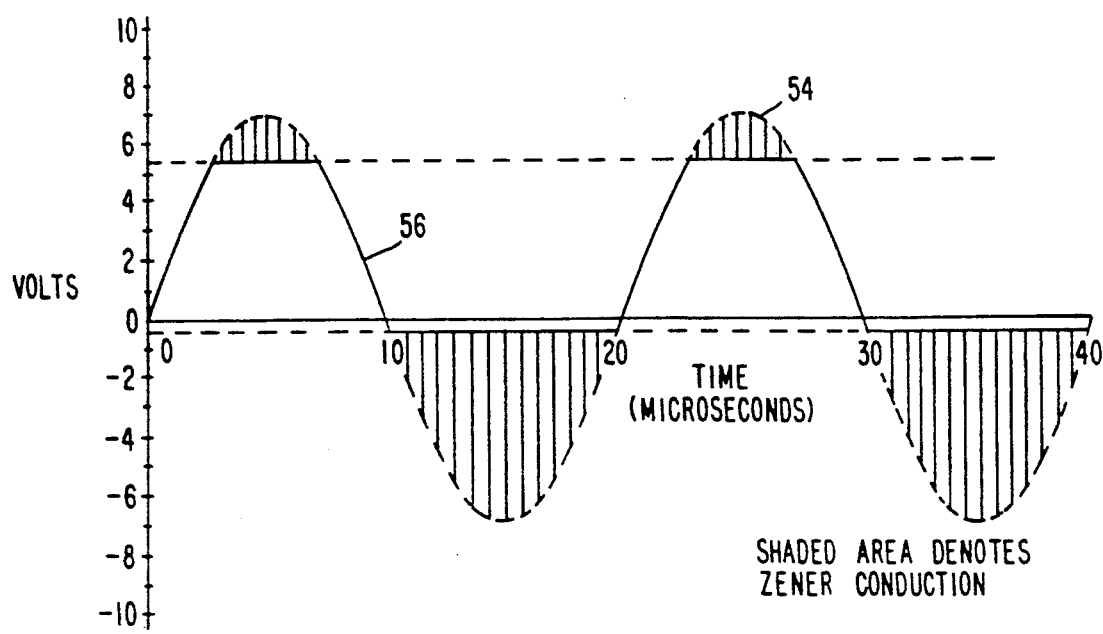
FIGS. 3 and 4 are waveforms helpful in describing the operation of the invention disclosed in the aforementioned application and which are applicable to the present invention.

Reference is now made to FIG. 1 of the drawing, a schematic diagram of a preferred embodiment of the invention disclosed in the aforementioned application wherein semiconductor bridge explosive initiator 24 is illustrated as including metal lands, i.e. ohmic contacts, 12 and 14 disposed on n-type semiconductor layer 16, typically a silicon layer highly doped with phosphorus disposed on non-electrically conducting substrate 18, fabricated of sapphire. Layer 16 has a relatively high carrier concentration, e.g., $10^{20}$ carriers per cubic centimeter. Alternatively, initiator 24 includes a silicon substrate on which is formed an $SiO_2$ layer on which is deposited an n-type silicon layer having a high carrier concentration and the lands form ohmic contacts on the n-type layer.

Lands 12 and 14, typically either aluminum or tungsten, are spaced from each other by a predetermined distance so that in response to a predetermined voltage being established across them for a predetermined time, a plasma is formed in gap 20 between the lands. A conventional explosive charge 22 contacts lands 12 and 14 and layer 16 across gap 20. The explosive charge is energized in response to energy from the plasma being applied to it for in excess of a predetermined time interval. Lands 12 and 14, layer 16, and substrate 18 form semiconductor bridge explosive initiator 24. As discussed supra, semiconductor bridge explosive initiator 24 has very predictable voltage, current, and time characteristics so that the standard deviation of the voltage required to initiate energization of explosive charge 22 of a lot of such bridge initiators is about 0.05 volts.

Bridge explosive initiator 24 is supplied with current from a source including DC power supply 26, connected to shunt capacitor 28 by way of current limiting resistor 30. Capacitor 28 is connected to semiconductor bridge explosive initiator 24 in response to closure of switch contacts 32. Capacitor 28 delivers a pulse having sufficient voltage, current and duration to initiate the plasma discharge across gap 20 between lands 12 and 14 to cause energization of explosive charge 22. The voltage of DC source 26 which charges capacitor 28 causes the capacitor to be charged to a voltage in excess of the rated discharge voltage between lands 12 and 14. Connected in shunt with lands 12 and 14 is a circuit consisting of zener diode 34 including cathode electrode 36 and anode electrode 38, respectively connected directly to lands 12 and 14. Zener diode 34 is illustrated as being a discrete component, but it is understood that it can be an integrated circuit component on substrate 18 with layer 16, as illustrated in FIG. 2.

FIG. 2 is a top view of semiconductor bridge 24, sans explosive charge 22, on a single integrated circuit substrate with zener diode 39. Zener diode 39 includes p-doped and n-doped silicon regions 40 and 42, formed on electrically nonconducting substrate 18. Regions 40 and 42 are doped, in the usual manner, to achieve zener breakdown characteristics and are arranged so that junction 43 is between them. Regions 40 and 42 are respectively connected to lands 12 and 14 by metal layers 44 and 46, preferably formed of aluminum, using well-known integrated circuit techniques.

Semiconductor bridge explosive initiator 24 is constructed so that in response to a predetermined voltage being applied between lands 12 and 14, a plasma is established in gap 20 through explosive 22. The integrated circuit techniques used to manufacture initiator 24 enable the voltage across lands 12 and 14 of different initiators to have an extremely small standard deviation, e.g., 0.05 volts, of the voltage necessary to initiate the plasma. Thereby, the firing voltage between lands 12 and 14 of the semiconductor bridge initiators is very predictable. If, for example, the design firing voltage between lands 12 and 14 is 5.0 volts, and the standard deviation of the firing voltage is 0.05 volts, the probability of the firing voltage being as low as 4.60 volts is one part in 100 million. Likewise, a voltage of 5.40 volts will initiate an explosion with a probability of failure of only 1 in 100 million.

It is, thereby, possible for zener diode 34 to have a backward breakdown voltage, i.e., a positive voltage between cathode 36 and anode 38 thereof, slightly more than the rated firing voltage (for example, 1.1 times) to positively prevent premature initiation of explosive charge 22 by DC electrostatic discharge or RF electromagnetic interference induced currents. The electrostatic discharge induced currents are likely to subsist across lands 12 and 14 as a result of machinery in the vicinity of initiator 24, in response to electrostatic charge from people, lightning, and other well-known phenomena. Electrostatic discharge pulses are usually less than 1 microsecond in duration. Electromagnetic interference induced currents across lands 12 and 14 are likely to occur in response to RF and other AC radiation fields, such as from radio transmitters and other equipment which emit stray AC fields.

To understand how the device of FIGS. 1 and 2 operates when a relatively low voltage, insufficient to activate charge 22, is applied across lands 12 and 14, assume that an EMI induced current causes an AC sinusoidal voltage having a peak to peak value of 7.07 volts and a frequency of 50 kilohertz to be applied between lands 12 and 14 and zener diode 34; also assume that charge 22 is fired in response to a 5.0 RMS voltage. The AC voltage has a peak positive voltage slightly more than 3.54 volts above a zero baseline and a negative peak voltage of 3.54 volts below the zero baseline.

Because the positive peak voltage is only slightly in excess of 3.5 volts there is no conduction through zener diode 34 during each positive half cycle of waveform 52. During each negative half cycle of waveform 52 zener diode 34 starts conducting when the voltage of land 12 is 0.6 volts below the voltage of land 14. Consequently, the voltage applied to gap 20 is the combination of the positive half cycles of the sinusoidal waveform and, essentially, a negative voltage square wave having a peak value of 0.6 volts. The threshold resistance across gap 20 prior to firing of charge 22 is constant, usually about 1 ohm. The inductance and capacitance of semiconducting bridge 24 are so small that they play no substantial part in causing a plasma to be formed between lands 12 and 14 in gap 20. The current flowing through the gap therefore has about the same numerical value as the voltage supplied to the gap by the EMI induced current. These voltages and currents are insufficient to heat charge 22 to an explosive state.

If the resistance of bridge 24 in gap 20 were higher than 1 ohm, there would be even less heating of explosive 22 in the gap since the current flowing in the gap would be reduced. Since heating in gap 20 is basically ohmic, in accordance with $I^2R$, the current reduction causes less heat to be generated in the gap, to prevent breakdown and energization of explosive 22.

The effective, i.e., heating value, of the alternating current in gap 20 is the root mean squared (RMS) value of the current applied to the gap. For a true sinusoid, the RMS current value ($I_{rms}$) is $I_{peak}/\sqrt{2}$, where $I_{peak}$ is the peak current above the base line. Since the peak current value for the positive half cycle of a sinewave is $I=E/R$, where E is the peak value of the voltage waveform (equal to 3.54 volts) and R is the resistance across gap 20 prior to breakdown (equal to 1 ohm typically), the peak current is 3.54 amperes. The RMS current value during the positive half cycles is, therefore, 2.5 amperes. The −0.6 volts applied to gap 20 during negative half-cycles of the sine wave is configured as a square wave, in the worst case situation. The −0.6 volts applied by the EMI induced current across gap 20 during negative half cycles of waveform 52 thus causes an RMS current of −0.6 amperes to flow in the gap, in this worst case situation. The RMS value of the voltage applied across gap 20 during one complete 20 microsecond cycle is thus $[(2.5)^2+(0.6)^2]^{\frac{1}{2}}$, which equals 2.57 volts and results in an RMS current of 2.57 amperes. The 7.07 peak to peak voltage resulting from one cycle of the EMI induced current across lands 12 and 14 thus produces heating effects in gap 20 that are far below the 5.0 volt threshold necessary to establish a discharge plasma to energize explosive charge 22.

Now consider how the circuit of FIGS. 1 and 2 operates in response to positive and negative electrostatic induced discharge currents; these currents have short durations, less than 10 microseconds. When the voltage of land 12 is more positive than the voltage of land 14 by more than 1.1 times the firing voltage of charge 22, a very low impedance is provided across charge 22 because zener diode 34 has a forward breakdown voltage 1.1 times the firing voltage of charge 22. The short duration (less than 10 μs) of the maximum voltage across charge 22 prevents activation of the charge. Zener diode 34, being fabricated of silicon, has a reverse breakdown voltage of 0.6 volts, so a very low impedance is between anode 38 and cathode 36 when land 14 is at a voltage at least 0.6 volts more positive than the voltage of land 12. Thus, no negative induced discharge current can trigger charge 22.

Figure 4:
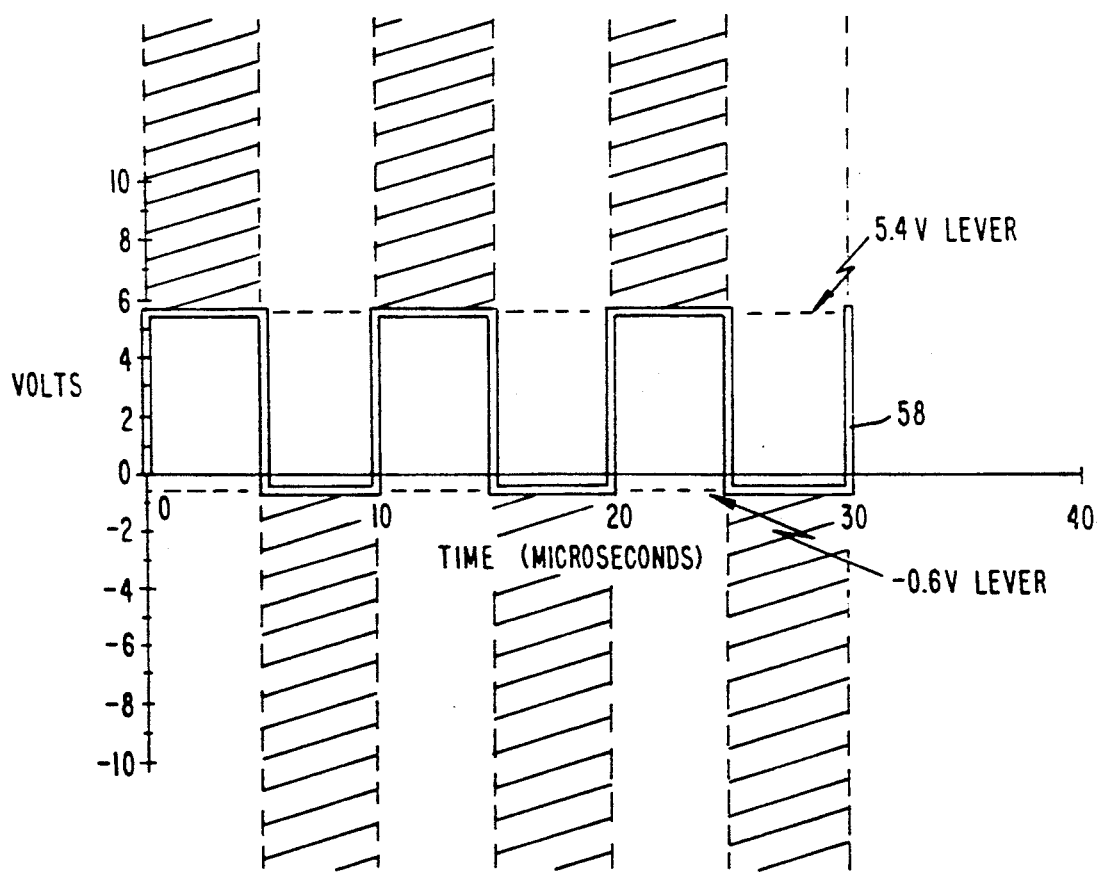

To understand how zener diode 34 prevents premature energization of explosive charge 22 by higher amplitude electromagnetic interference induced currents and the AC voltage associated therewith, consideration is given to FIGS. 3 and 4. The operations described in connection with FIGS. 3 and 4 are based on the following assumptions: (1) bridge 24 has a resistance of 1 ohm, (2) charge 22 is energized in response to a DC voltage of 5.0 volts being applied for 10 microseconds, and (3) silicon zener diode 34, shunting gap 20 of bridge 24, has a breakdown in the forward direction when the anode is 0.6 volts positive relative to the cathode and a breakdown in the reverse or backward direction when the cathode is 5.4 volts positive relative to the anode.

Consider the situation illustrated in FIG. 3 wherein an AC voltage having a peak to peak value of 14.1 volts, as indicated by sinusoidal waveform 54, is established between lands 12 and 14 in response to EMI induced current having a frequency of 50 kilohertz. Without zener diode 34 present, the RMS value of the voltage is 5.0 volts (resulting in an RMS current value of 5.0 amps), which is sufficient to energize gap 20 and initiate explosive 22. The sinusoidal variations of waveform 54 are converted by zener diode 34 into clipped waveform 56 having a peak positive voltage of 5.4 volts and a peak negative voltage of −0.6 volts. Between the peak positive and negative voltages, waveform 56 has a wave shape identical to waveform 54. It can be shown that the RMS voltage of waveform 56 over one complete 20 microsecond period of waveform 54 is 3.11 volts, a value considerably less than the 5.0 volts required for energization of explosive charge 22. Hence, zener diode 34 protects charge 22 from premature energization over one complete cycle of waveform 54.

Zener diode 34 also protects charge 22 over one positive half-cycle of waveform 54. If the RMS voltage applied to gap 20 over the 10 microsecond time period is less than 5.0 volts, insufficient heat is applied to the gap to energize explosive charge 22. As can be mathematically shown, when waveform 54 is applied across lands 12 and 14, the RMS or effective heating value of the voltage in gap 20 is 4.36 volts. The likelihood of a semiconductor bridge being so out of specification that it would fire in response to a voltage of 4.36 volts is much less than one in one hundred million, i.e., over ten standard deviations. Since the integrated circuit process used to manufacture semiconductor bridge 24 results in bridges having very repeatable characteristics, zener diode 34 effectively protects premature energization of explosive charge 22.

As the voltage resulting from the EMI induced current increases, the shape of waveform 56 during the positive half cycles of waveform 54 becomes closer to a square wave, with a positive plateau voltage of 5.4 volts. Therefore, for high amplitude voltages resulting from relatively low frequency (e.g., 20 kilohertz waves, the RMS voltage for 10 microseconds across gap 20 may exceed 5.0 volts. However, coupling ability of a 50 kilohertz signal into a semiconductor bridge initiator assembly is either nil or very limited.

Reference is now made to FIG. 4 of the drawings wherein it is assumed that a 100 kilohertz voltage results in gap 20 in response to the EMI induced current. The induced voltage is sufficiently high to cause square wave 58, having a positive peak voltage of 5.4 volts and a negative peak value of −0.6 volts, to subsist across gap 20. Each half cycle of square wave 58 has a duration of 5 microseconds. While it is very unlikely that such a square wave would be imposed across gap 20, waveform 58 is instructive to provide an indication of the effectiveness of zener diode 34 in preventing premature energization of explosive charge 22. In the situation of FIG. 4, a voltage of 5.4 volts is impressed across gap 20 for only 5 microseconds. The RMS value of the positive voltage impressed across gap 20 for the 5 microsecond interval is 5.4 volts. The 5.4 volts RMS during the positive half cycles of waveform 58, when combined with the RMS heating effects during the negative half cycle, is only 3.8 volts, considerably less than the 5.0 volt level necessary to energize explosive charge 22. This relationship never changes as the frequency increases.

Figure 5:
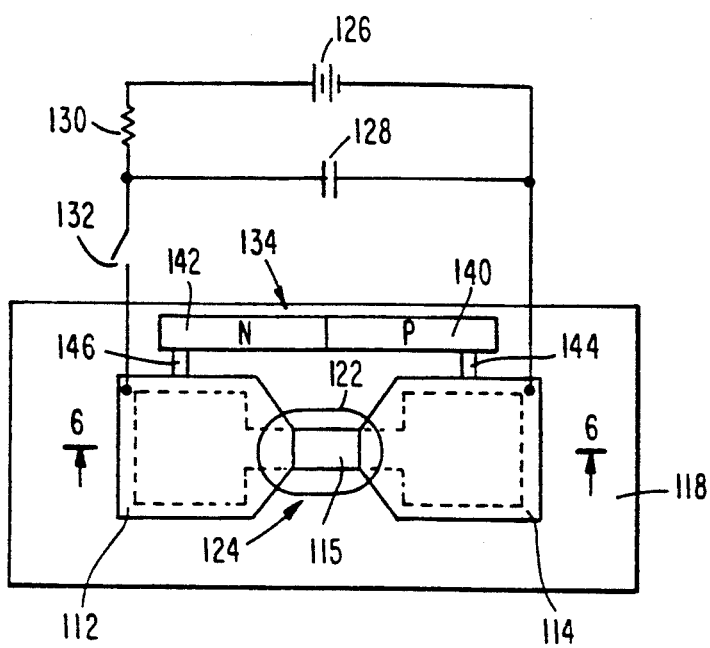
FIG. 5 is a top view of an embodiment of the present invention.
Figure 6:
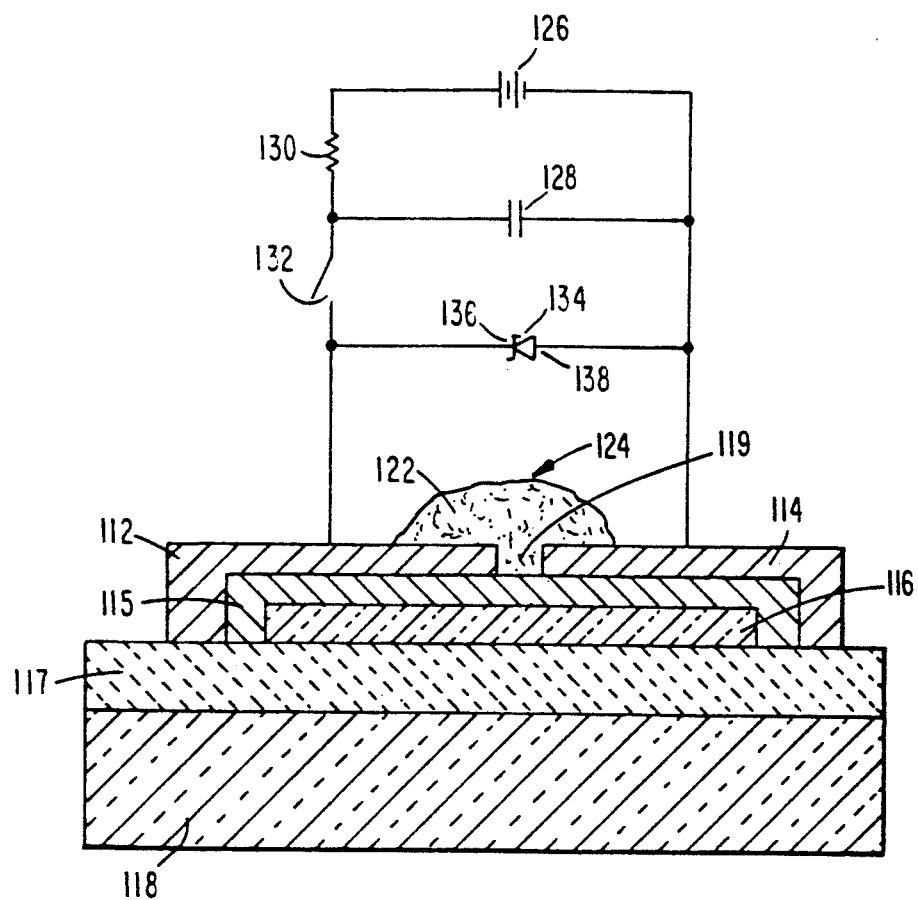
FIG. 6 is a partial side view and partial schematic view of the apparatus illustrated in FIG. 5.

Reference is now made to FIGS. 5 and 6 of the drawing, respectively top and side views of an integrated circuit bridge in accordance with another embodiment of the invention, utilizing the principles disclosed in aforementioned U.S. Pat. No. 4,976,200. The structure of FIGS. 5 and 6 includes an electrically non-conductive substrate 118, preferably formed of undoped silicon, on which is deposited oxide layer 117, in turn partially covered by undoped silicon layer 116. Covering layer 116 is metal layer 115, having a relatively high electrical resistivity, compared to the resistivity of highly conductive metals, such as aluminum, copper and silver. In the preferred embodiment, layer 115 is tungsten. Tungsten layer 115 is partially covered by low resistivity metal lands 112 and 114, preferably formed of aluminum. Lands 112 and 114 are spaced from each other by gap 119, across which extends a portion of relatively high resistivity metal layer 115. Hence, lands 112 and 114 are spaced and electrically insulated from each other due to (1) the connection of the lands to oxide, electrically insulating layer 117 and (2) gap 119 between the lands across relatively high resistivity layer 115. Gap 119 and the portion of the upper faces of lands 112 and 114 are filled and covered with explosive charge 122.

In response to sufficient voltage being applied between lands 112 and 114, a plasma breakdown occurs in tungsten layer 115 between lands 112 and 114 in gap 119. The plasma discharge has sufficient energy and heat to explode charge 122.

We have found, through actual experimentation, that integrated circuit devices of the type illustrated in FIGS. 5 and 6, including substrate 118, layers 115–117 and lands 112 and 114, have repeatable characteristics of the same type as mentioned supra with regard to the doped semiconductor structures. We postulate that devices of the type illustrated in FIGS. 5 and 6 have the same type of repeatable characteristics as the devices illustrated in FIGS. 1 and 2 because of the precision with which the devices are made by using integrated circuit techniques, causing the plasma to be formed on a very consistent basis for the same breakdown voltages, currents and pulse durations. We further postulate that any explosive bridge made with current state of the art integrated circuit techniques in which a plasma is formed between a pair of lands spaced from each other by a gap will demonstrate the same type of repeatable and predictable performance. Therefore, we believe any integrated circuit explosive bridge of the above type appears to be adaptable for use with the zener diode EMI and ESD protective circuit.

As illustrated in FIG. 6, a zener diode protection circuit similar to that described in connection with FIGS. 1 and 2 includes zener diode 138 having anode and cathode electrodes respectively connected to lands 112 and 114. Zener diode 134 is connected to a power supply for activating the explosive bridge circuit mounted on substrate 118 via normally open switch 132. Switch 132 is connected to DC source 126, in turn connected to storage capacitor 128 and resistor 130. While contacts of switch 132 are closed, anode 136 and cathode 138 of zener diode 134 are respectively connected to the negative and positive terminals of DC supply 126.

Zener diode 134 is preferably part of the integrated circuit formed on substrate 118, as illustrated in FIG. 5. To this end, zener diode 134 includes p-type region 140 and n-type region 142, respectively connected to lands 112 and 114 by metal contact strips 144 and 146.

The structure of FIGS. 5 and 6 provides protection for the integrated circuit explosive bridge arrangement mounted on substrate 118 in substantially the same manner as the manner in which zener diode 34 protects the explosive bridge circuit mounted on substrate 18, FIGS. 1 and 2, and as described in connection with FIGS. 3 and 4.

From the foregoing, it is seen that as a result of the combination of the characteristics of semiconductor bridge 24 and zener diode 34 or integrated circuit bridge 124 and zener diode 134, charges 22 and 122 are effectively protected from premature energization by electrostatic discharge and electromagnetic interference induced currents.

While there have been described and illustrated several specific embodiments of the invention, it will be clear that variations in the details of the embodiments specifically illustrated and described may be made without departing from the true spirit and scope of the invention as defined in the appended claims.

We claim:

1. In combination, an integrated circuit bridge comprising a substrate of non-electrically conductive material and a semiconductor layer carried by the substrate; first and second metal lands forming contacts of the integrated circuit bridge, the metal lands being arranged so that there is a gap between them; an explosive charge on the lands bridging the gap; the lands, gap, integrated circuit bridge, and charge being dimensioned and arranged so that in response to a current or voltage equal to or in excess of a predetermined level having a time duration equal to or in excess of a predetermined value being applied to the gap, a plasma having sufficient energy to energize the charge is formed in the gap; the predetermined current having a predetermined minimum firing voltage associated therewith, the integrated circuit bridge being one of a lot having a minimum firing voltage standard deviation of about no greater than 0.05 volts; and means for preventing energization of the explosive by (a) electrostatic discharge currents having associated therewith voltages higher than the firing voltage of the integrated circuit bridge and (b) electromagnetic induced AC currents; said means for preventing including a zener diode having anode and cathode electrodes respectively connected to said first and second lands, said zener diode conducting (a) in the forward direction in response to a voltage of about $-0.6$ volts being applied across the cathode and anode and (b) in the backward (reverse) direction in response to a positive voltage slightly in excess of the predetermined minimum firing voltage being applied across the cathode and anode.

2. The combination of claim 1 wherein the zener diode is an integrated circuit component on the same substrate as the layer and lands.

3. The combination of claim 1 wherein the zener diode is a discrete component.

4. The combination of claim 1 further including a DC source having positive and negative electrodes, a capacitor connected to be charged by the DC source so that a first electrode of the charged capacitor is at a positive voltage relative to a second electrode thereof; and normally open switch means connected to said capacitor lands and zener diode so that when the switch means is closed, positive current flows from the first electrode of the capacitor to the first land; thence across the gap to the second land and back to the second electrode of the capacitor, the voltage supplied by the capacitor to the gap having a value in excess of the predetermined value for more than said duration.

5. The combination of claim 1 wherein the positive voltage is about 1.1 times the predetermined firing voltage.

6. The combination of claim 1 wherein the bridge comprises a metal layer on the semiconductor layer, the metal layer extending between the gap, the land having a resistivity much smaller than the metal layer.

7. The combination of claim 6 wherein the metal layer is tungsten and the tungsten and semiconductor layers are on an oxide layer on the substrate.

8. The combination of claim 7 wherein the substrate and semiconductor layers are undoped silicon.

9. In combination, an integrated circuit bridge comprising a substrate of non-electrically conductive material and a semiconductor layer carried by the substrate; first and second metal lands forming contacts of the integrated circuit bridge, the metal lands being arranged so that there is a gap between them across the integrated circuit bridge; an explosive charge on the lands bridging the gap; the lands, gap, integrated circuit bridge, and charge being dimensioned and arranged so that in response to a current or voltage equal to or in excess of a predetermined level having a time duration equal to or in excess of a predetermined value, a plasma having sufficient energy to energize the charge is formed in the gap; the predetermined current having a predetermined minimum firing voltage associated therewith, the integrated circuit bridge being one of a lot made by integrated circuit manufacturing techniques having a relatively low firing voltage standard deviation; and means for preventing energization of the explosive by (a) electrostatic discharge currents having associated therewith voltages having values greater than the firing voltage and (b) electromagnetic induced AC currents; said means for preventing including a zener diode having anode and cathode electrodes respectively connected to said first and second lands, said zener diode conducting (a) in the forward direction in response to a negative voltage that is a small percentage of the firing voltage being applied across the cathode and anode and (b) in the backward (reverse) direction in response to a positive voltage slightly in excess of the predetermined minimum firing voltage being applied across the cathode and anode.

10. The combination of claim 9, wherein the standard deviation is about 0.05 volts.

11. The combination of claim 9, wherein the negative voltage is about 0.6 volts.

12. The combination of claim 11 wherein the positive voltage is about 1.1 times the predetermined firing voltage.

13. The combination of claim 9 wherein the zener diode is an integrated circuit component on the same substrate as the layer and lands.

14. The combination of claim 9 wherein the zener diode is a discrete component.

15. The combination of claim 9 further including a DC source having positive and negative electrodes, a capacitor connected to be charged by the DC source so that a first electrode of the charged capacitor is at a positive voltage relative to a second electrode thereof; and normally open switch means connected to said capacitor and lands, and zener diode so that when the switch means is closed, positive current flows from the first electrode of the capacitor to the first land; thence across the gap to the second land and back to the second electrode of the capacitor, the voltage supplied by the capacitor to the gap having a value in excess of the predetermined value for more than said duration.

16. The combination of claim 9 wherein the bridge comprises a metal layer on the semiconductor layer, the metal layer extending between the gap, the land having a resistivity much smaller than the metal layer.

17. The combination of claim 16 wherein the metal layer is tungsten and the tungsten and semiconductor layers are on an oxide layer on the substrate.

18. The combination of claim 17 wherein the substrate and semiconductor layers are undoped silicon.

* * * * *